(12) United States Patent
Jose et al.

(10) Patent No.: US 9,123,408 B2
(45) Date of Patent: Sep. 1, 2015

(54) LOW LATENCY SYNCHRONIZATION SCHEME FOR MESOCHRONOUS DDR SYSTEM

(71) Applicant: QUALCOMM Incorporated, San Diego, CA (US)

(72) Inventors: Edwin Jose, San Diego, CA (US); Michael Drop, San Diego, CA (US); Xuhao Huang, San Diego, CA (US); Raghu Sankuratri, San Diego, CA (US); Deepti Sriramagiri, San Diego, CA (US); Marzio Pedrali-Noy, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 147 days.

(21) Appl. No.: 13/902,705

(22) Filed: May 24, 2013

(65) Prior Publication Data

US 2014/0347941 A1 Nov. 27, 2014

(51) Int. Cl.
*G11C 7/22* (2006.01)
*G06F 13/16* (2006.01)
*G11C 7/10* (2006.01)
*G11C 11/4093* (2006.01)

(52) U.S. Cl.
CPC ............ *G11C 7/222* (2013.01); *G06F 13/1689* (2013.01); *G11C 7/1084* (2013.01); *G11C 7/1093* (2013.01); *G11C 11/4093* (2013.01); *G11C 2207/2254* (2013.01); *Y02B 60/1228* (2013.01)

(58) Field of Classification Search
CPC .... G11C 7/222; G11C 7/1066; G11C 7/1084; G11C 7/1093; G11C 11/4093; G11C 2207/2254; G06F 1/04; G06F 1/12; G06F 13/1689; Y02B 60/1228
USPC ........ 365/191, 189.18, 233.11; 711/167, 170; 713/400, 600; 375/354
See application file for complete search history.

(56) References Cited

U.S. PATENT DOCUMENTS 5,548,620 A * 8/1996 Rogers .......................... 375/354
7,236,556 B2 6/2007 Ward et al.
7,269,093 B2 9/2007 Gregorius et al.

(Continued)

OTHER PUBLICATIONS

An 8.2 to 20.1 ghz lc PLL with sub-100 fs jitter in 0.13 ?m sige bicmos Demirkan, Murat Agilent Technol., Santa Clara, CA, USA Steinbach, Günter; Nishimura, Ken A.; Keane, John P.; Wüppermann, Bernd E. Oct. 3-6, 2010 Compound Semiconductor Integrated Circuit Symposium (CSICS), 2010 IEEE Date of Conference: Oct. 3-6, 2010 pp: 1-4 Product Type: Conference Publications Located via IEEE Xplore.

(Continued)

*Primary Examiner* — Han Yang
*Assistant Examiner* — Xiaochun L Chen
(74) *Attorney, Agent, or Firm* — Novak Druce Connolly Bove + Quigg LLP

(57) ABSTRACT

In one embodiment, a memory interface comprises a cleanup phase-locked loop (PLL) configured to receive a reference clock signal, and to generate a clean clock signal based on the reference clock signal. The memory interface also comprises a synchronization circuit configured to receive data, a data clock signal, and the clean clock signal, wherein the synchronization circuit is further configured to sample the data using the data clock signal, and to synchronize the sampled data with the clean clock signal.

25 Claims, 11 Drawing Sheets

(56) References Cited

U.S. PATENT DOCUMENTS

| | | |
|---|---|---|
| 7,532,697 B1 | 5/2009 | Sidiropoulos et al. |
| 8,145,171 B2 | 3/2012 | Lin et al. |
| 8,356,155 B2 * | 1/2013 | Searles et al. ................ 711/167 |
| 8,880,831 B2 * | 11/2014 | Krishnan et al. ............. 711/167 |
| 2009/0154629 A1 | 6/2009 | Pyeon et al. |
| 2010/0005214 A1 | 1/2010 | Trombley et al. |
| 2011/0239030 A1 * | 9/2011 | Ware et al. ................... 713/400 |
| 2012/0056653 A1 | 3/2012 | Maheshwari et al. |
| 2013/0124806 A1 * | 5/2013 | Searles et al. ................ 711/154 |

OTHER PUBLICATIONS

International Search Report and Written Opinion—PCT/US2014/000141—ISA/EPO—Nov. 11, 2014.

* cited by examiner

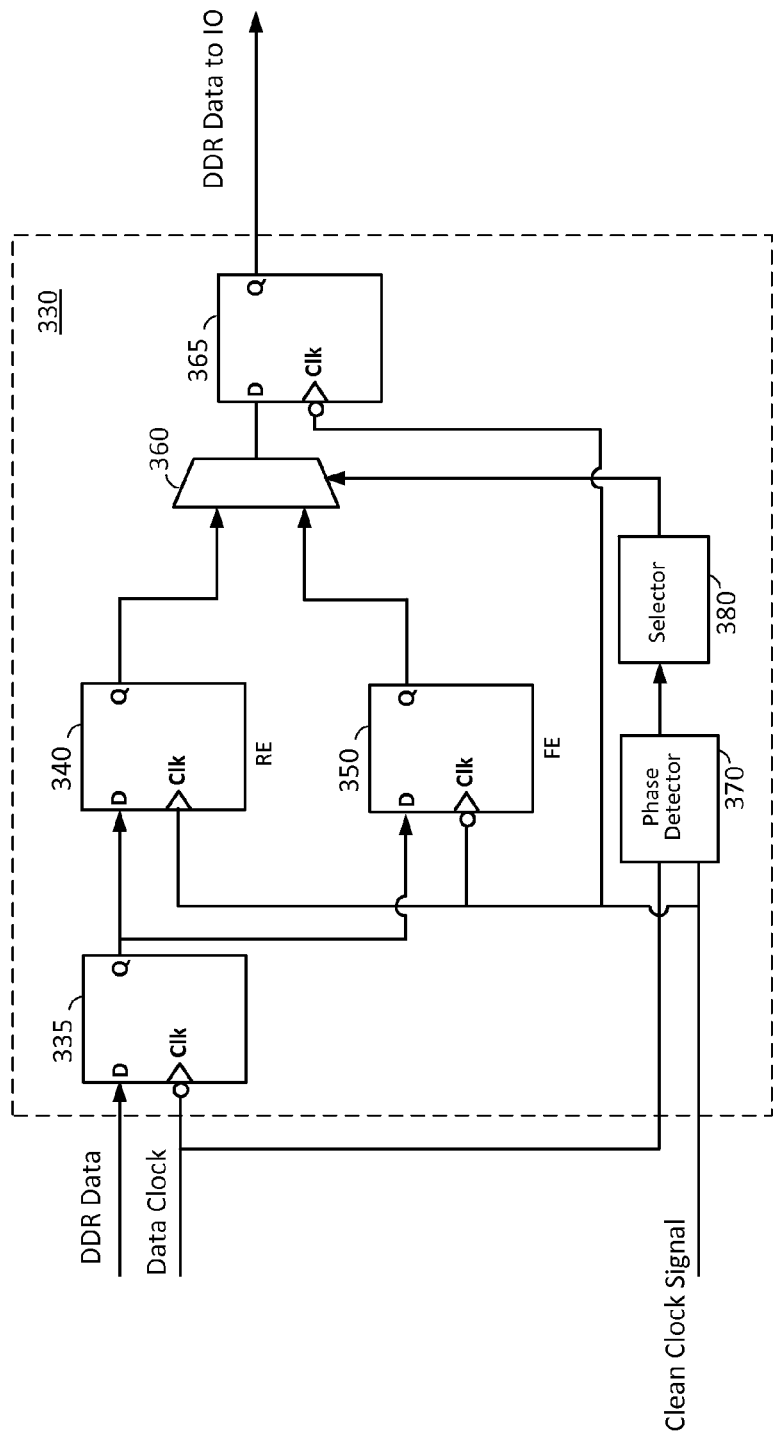
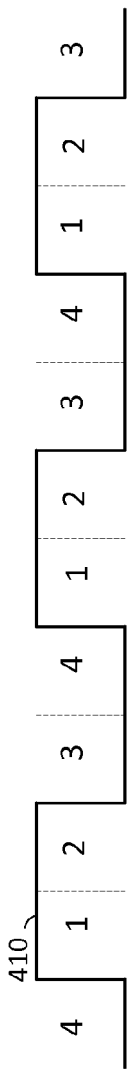
FIG. 3
FIG. 4

|  | FE2 | RE2 | FE1 | RE1 | FE0 | RE0 | Launch |
|---|---|---|---|---|---|---|---|
| 4(n-1) | | | ▨ | | | | |
| 1(n-1) | | | ▨ | | | | |
| 2(n-1) | | | | ▨ | | | |
| 3(n) | | | | ▨ | | | |
| 4(n) | | | | | ▨ | | |
| 1(N) | | | | | ▨ | | |
| 2(n) | | | | | | ▨ | |
| 3(n+1) | | | | | | ▨ | |
| 4(n+1) | | | | | | | ▨ |
| 1(n+1) | | | | | | | ▨ |
905
FIG. 9
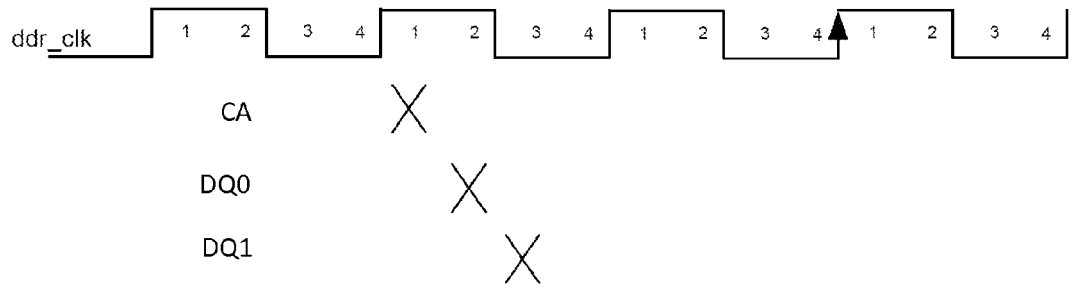
FIG. 10
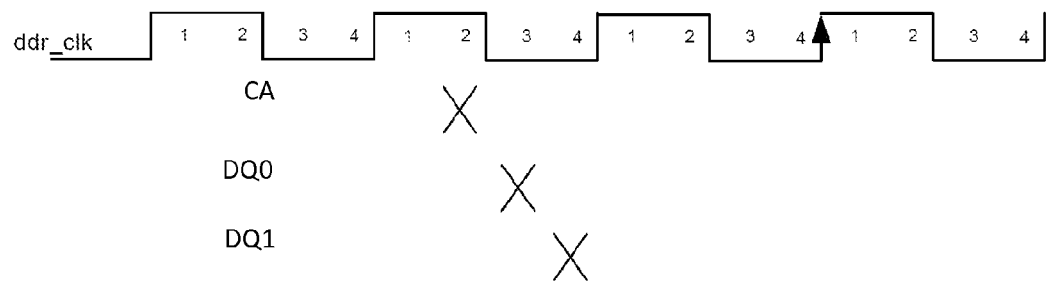
FIG. 11

| | FE2 | RE2 | FE1 | RE1 | FE0 | RE0 | Launch |
|---|---|---|---|---|---|---|---|
| 4(n-1) | | | DEF | | | | |
| 1(n-1) | PUSH | | DEF | | | | |
| 2(n-1) | | PUSH | | DEF | | | |
| 3(n) | | PUSH | | DEF | | | |
| 4(n) | | | PUSH | | DEF | | |
| 1(N) | | | PUSH | | DEF | | |
| 2(n) | | | | PUSH | | DEF | |
| 3(n+1) | | | | PUSH | | | |
| 4(n+1) | | | | | PUSH | | |
| 1(n+1) | | | | | PUSH | | |

|  | FE2 | RE2 | FE1 | RE1 | FE0 | RE0 | Launch |
|---|---|---|---|---|---|---|---|
| 4(n-1) |  |  | DEF |  |  |  |  |
| 1(n-1) |  |  | DEF |  |  |  |  |
| 2(n-1) |  |  |  | DEF |  |  |  |
| 3(n) |  | PUSH |  | DEF |  |  |  |
| 4(n) |  |  | PUSH |  | DEF |  |  |
| 1(N) |  |  | PUSH |  | DEF |  |  |
| 2(n) |  |  |  | PUSH |  | DEF |  |
| 3(n+1) |  |  |  | PUSH |  | DEF |  |
| 4(n+1) |  |  |  |  | PUSH |  |  |
| 1(n+1) |  |  |  |  | PUSH |  |  |

LOW LATENCY SYNCHRONIZATION SCHEME FOR MESOCHRONOUS DDR SYSTEM

BACKGROUND

1. Field

Aspects of the present disclosure relate generally to memory interfaces, and more particularly, to synchronization systems and methods for memory interfaces.

2. Background

A system on a chip (SoC) may include a memory interface for interfacing one or more blocks (e.g., CPU, GPU, etc.) on the SoC with an external memory device. The memory interface may comprise a centrally-located memory controller, and a plurality of physical (PHY) blocks located along the periphery of the SoC. The memory controller manages the flow of data between the external memory device and blocks on the SoC that need to access the external memory device. When a block on the SoC needs to write data to the memory external device, the memory controller sends the data to one or more of the PHY blocks along with a clock signal and a command/address (CA) signal. The one or more PHY blocks condition the data, the clock signal and the CA signal for output to the external memory device in accordance with an applicable memory standard.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a memory interface is described herein. The memory interface comprises a cleanup phase-locked loop (PLL) configured to receive a reference clock signal, and to generate a clean clock signal based on the reference clock signal. The memory interface also comprises a synchronization circuit configured to receive data, a data clock signal, and the clean clock signal, wherein the synchronization circuit is further configured to sample the data using the data clock signal, and to synchronize the sampled data with the clean clock signal.

A second aspect relates to a method for data synchronization. The method comprises generating a clean clock signal based on a reference clock signal, sampling data using a data clock signal, and synchronizing the sampled data with the clean clock signal.

A third aspect relates to an apparatus for synchronizing data. The apparatus comprises means for generating a clean clock signal based on a reference clock signal, means for sampling data using a data clock signal, and means for synchronizing the sampled data with the clean clock signal.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

BRIEF DESCRIPTION OF THE DRAWINGS

FIG. 3 shows a synchronization circuit according to an embodiment of the present disclosure.

FIG. 4 shows a clean clock signal divided into quadrants according to an embodiment of the present disclosure.

FIG. 9 shows a truth table according to an embodiment of the present disclosure.

FIGS. 10 and 11 show examples of delay mismatches between physical (PHY) blocks in a memory interface.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
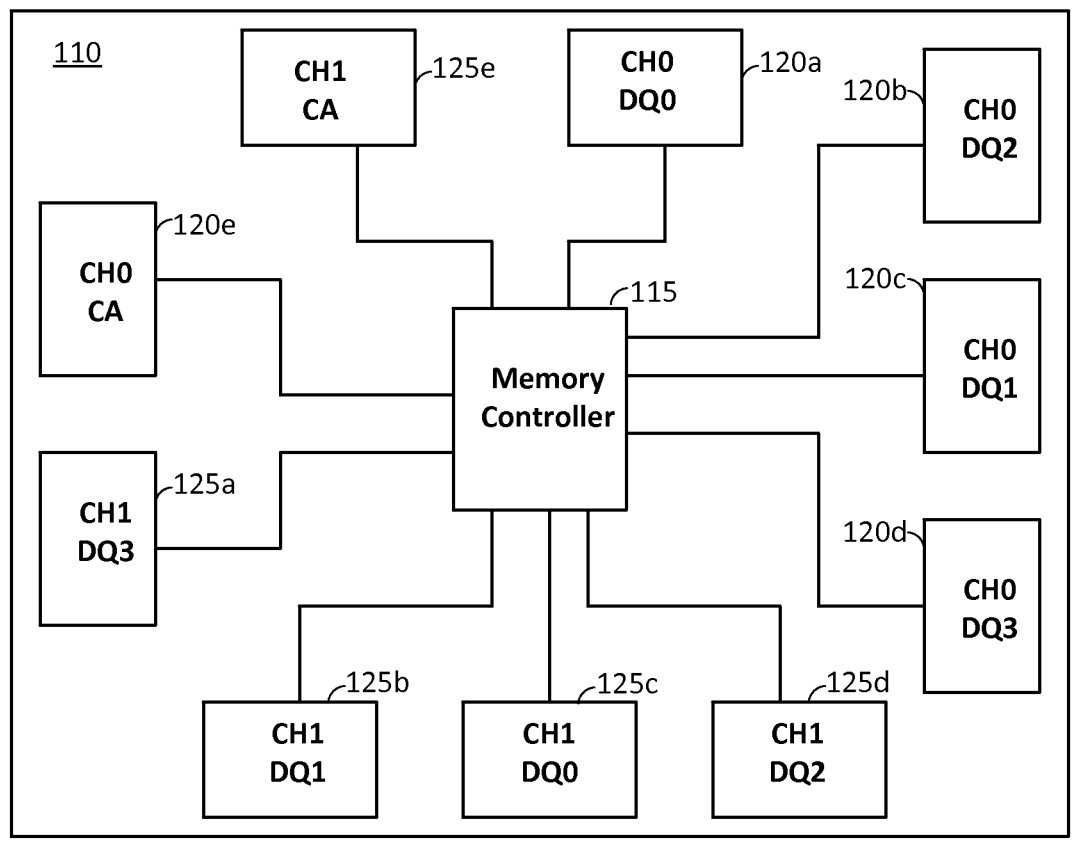
FIG. 1 shows an example of a system on a chip (SoC) with a memory interface.

FIG. 1 shows an example of a system on a chip (SoC) 110 with a memory interface for interfacing one or more blocks (e.g., CPU, GPU, etc.) on the SoC 110 with an external memory device (e.g., double data rate synchronous dynamic random access memory (DDR SDRAM)). For simplicity, the external memory device and the blocks on the SoC 110 that access the external memory using the memory interface are not shown in FIG. 1. The memory interface is described below using the example of an external DDR SDRAM, although it is to be appreciated that the present disclosure is not limited to this example and may be applied to other types of memory devices.

The memory interface comprises a centrally-located memory controller 115, and a plurality of physical (PHY) blocks 120a-120e and 125a-125e located along the periphery of the SoC 110. The memory controller 115 manages the flow of data between the external DDR SDRAM and a block on the SoC 110 that needs to access the external DDR SDRAM. Memory access may include writing data to and reading data from the external DDR SDRAM. For example, when a block on the SoC 110 needs to write data to the external DDR SDRAM, the memory controller 115 generates and sends the corresponding DDR data, clock signal and command/address (CA) signal to one or more of the PHY blocks 120a-120e and 125a-125e. The one or more PHY blocks 120a-120e and 125a-125e condition the DDR data, clock signal and CA signal for output to the external DDR SDRAM in accordance with an applicable memory standard.

The DDR data may have a width of four bytes corresponding to a four-byte data word. In this example, the memory controller 115 sends four bytes of the DDR data in parallel to four of the PHY blocks (e.g., PHY blocks 120a-120d), in which each byte is sent to a different one of the four PHY blocks. The memory controller 115 also sends the clock signal to each of the four PHY blocks. Thus, each of the four PHY blocks receives the respective byte of the DDR data and the clock signal. The memory controller 115 also sends the CA signal to a fifth one of the PHY blocks (e.g., PHY block 120e) for output to the external DDR SDRAM.

In the example shown in FIG. 1, the SoC 110 has two memory channels (denoted CH0 and CH1) for transferring DDR data to the same memory device or different memory devices. For example, the memory controller 115 may send DDR data and a CA signal for channel CH0 to PHY blocks 120a-120e. The DDR data for channel CH0 may have a width of four bytes (denoted DQ0, DQ1, DQ2 and DQ3), in which each byte is sent to a respective one of the PHY blocks 120a-120d. The CA signal for channel CH0 is sent to PHY block 120e. The memory controller 115 may send DDR data and a CA signal for channel CH1 to PHY blocks 125a-125e. The DDR data for CH1 may have a width of four bytes (denoted DQ0, DQ1, DQ2 and DQ3), in which each byte is sent to a respective one of the PHY blocks 125a-125d. The CA signal for channel CH0 is sent to PHY block 125e.

Interfacing with the DDR SDRAM can be extremely challenging due to high speeds, which translate into tight timing requirements that need to be met between the SoC and the DDR SDRAM. One challenge is distributing the centrally-generated DDR data and clock signal for the different bytes all the way to the corresponding PHY blocks on the periphery on the SoC. In addition, the PHY blocks may be spaced far apart along the periphery of the SoC. As a result, the different bytes of the DDR data and the clock signal have to traverse different paths to the periphery of the SoC over relatively long distances (e.g., 10 to 20 millimeters).

One approach to address the above problems is to send the DDR data from the centrally-located memory controller to the periphery of the SoC via a source synchronous interface. However, this approach becomes extremely tedious and nearly unachievable when clock speeds reach the gigahertz range. The clock reaching the DDR SDRAM also has to meet tight jitter (Tjit) and duty cycle (Tdc) requirements, which is difficult to achieve for a centrally-generated clock that is distributed to the periphery of the SoC due to voltage and temperature induced jitter on various parts of the SoC.

Another approach for sending data across the SoC is to use a standard asynchronous clock domain crossing circuit such as a first-in-first-out (FIFO) device. This approach incurs several additional clock cycles for the domain crossing, which can be a huge penalty for a latency-sensitive system. This approach also requires coordination between the PHY blocks to make sure that bytes corresponding to the same word of the DDR data are aligned when they are output to the external DDR SDRAM.

Figure 2:
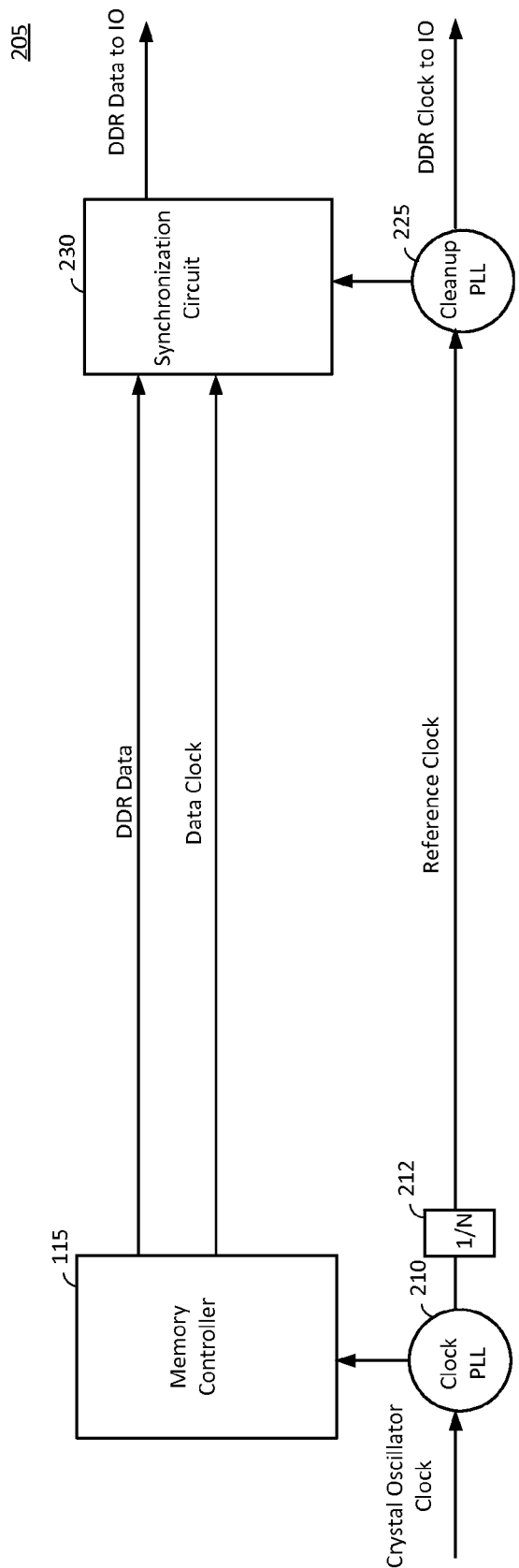
FIG. 2 shows a memory interface according to an embodiment of the present disclosure.

FIG. 2 shows a memory interface 205 according to an aspect of the present disclosure. The memory interface 205 comprises the memory controller 115 and a clock phase-locked loop (PLL) 210, both of which may be centrally located on the SoC 110. The memory interface 205 also comprises a cleanup PLL 225 and a synchronization circuit 230, both of which are located near the periphery of the SoC 110 and may be included in one of the PHY blocks shown in FIG. 1. The memory interface 205 may also comprise a frequency divider 212.

In operation, the clock PLL 210 receives an input clock signal from a crystal oscillator (not shown), and generates an output clock signal based on the input clock signal. The memory controller 115 generates DDR data based on data from a block (not shown) on the SoC 110 accessing the external DDR SDRAM. The memory controller 115 also generates a data clock signal based on the output clock signal from the clock PLL 210. For high-speed data transfer, the data clock signal may have a frequency of about one gigahertz or more. The memory controller 115 outputs the DDR data and the data clock signal to the synchronization circuit 230. The DDR data may be aligned with rising edges of the data clock signal at the memory controller 115. The DDR data and the data clock signal may travel over a relatively long distance (e.g., 10 to 20 millimeters) across the SoC 110 from approximately the center of the SoC 110 to the synchronization circuit 230, which is located near the periphery of the SoC 110.

The frequency divider 212 also receives the output clock signal from the clock PLL 210, and divides the frequency of the output clock signal by N to generate a lower-frequency reference clock signal, which is output to the cleanup PLL 225. The frequency reduction is done to reduce power consumption since a lower frequency clock signal consumes less power. The reference clock signal travels over a relatively long distance (e.g., 10 to 20 millimeters) across the SoC 110 from approximately the center of the SoC 110 to the cleanup PLL 225, which is located near the periphery of the SoC 110. As a result, the reference clock signal accumulates jitter from various parts of the SoC by the time the reference clock signal reaches the cleanup PLL 225.

The cleanup PLL 225 reduces the jitter in the reference clock signal and multiples up the frequency of the reference clock signal by N to produce a clean clock signal. The clean clock signal may have the same frequency as the data clock signal, but not necessarily the same phase. The cleanup PLL 225 reduces jitter using a loop filter (e.g., a low-pass loop filter) that attenuates the jitter. The clean clock signal may be used for a DDR output clock signal that is output to the external DDR SDRAM. This is because the clean clock signal (which is generated near the periphery of the SoC 110) only has to travel a short distance to reach an TO pin of the SoC 110 for output to the external DDR SDRAM, and therefore has low jitter. The clean clock signal may also be used to generate a data strobe signal to the DDR SDRAM, which the DDR SDRAM may use to sample (capture) the DDR data. The low jitter makes it easier to meet clock and data strobe timing requirements to the DDR SDRAM.

The synchronization circuit 230 receives the DDR data and data clock signal from the memory controller 115 and the clean clock signal from the cleanup PLL 225, which is located near the synchronization circuit 230 and is therefore local to the synchronization circuit 230. The synchronization circuit 230 samples (captures) the DDR data using the data clock signal. For example, the synchronization circuit 230 may capture DDR data on the rising or falling edges of the data clock signal. The synchronization circuit 230 then synchronizes the captured DDR data with the clean clock signal. Thus, the synchronization circuit 230 retimes the DDR data from the data clock domain to the clean clock domain. The synchronization circuit 230 may output the retimed DDR data to the external DDR SDRAM. The retimed DDR data may be output directly to the external DDR SDRAM via one or more IO pins on the SoC 110, or may undergo additional processing at the respective PHY block before being output to the external DDR SDRAM via the one or more IO pins.

Although one synchronization circuit and one cleanup PLL are shown in FIG. 2 for ease of illustration, it is to be appreciated that the memory interface may comprise a plurality of synchronization circuits and cleanup PLLs at different locations along the periphery of the SoC 110. For example, each of the PHY blocks shown in FIG. 1 may include one or more synchronization circuits and one or more cleanup PLLs.

FIG. 3 shows a synchronization circuit 330 according to one embodiment of the present disclosure. The synchronization circuit 330 comprises a first-stage flip-flop 335, a rising-edge (RE) flip-flop 340, a falling-edge (FE) flip-flop 350, an output flip-flip 365, a multiplexer 360, a phase detector 370, and a selector 380.

The first-stage flip-flop 335 receives DDR data and the data clock signal from the memory controller 115, and samples (captures) the DDR data on the falling edges of the data clock signal. The first-stage flip-flop 335 outputs the sampled (captured) DDR data to the RE flip-flop 340 and the FE flip-flip 350.

The RE flip-flop 340 samples the DDR data from the first-stage flip-flop 335 on the rising edges of the clean clock signal, and the FE flip-flop 350 samples the DDR data from the first-stage flip-flop 335 on the falling edges of the clean clock signal. The RE flip-flop 340 and the FE flip-flip 350 output the RE-sampled DDR data and the FE-sampled DDR data, respectively, to the multiplexer 360. The multiplexer 360 selectively outputs the RE-sampled DDR data or the FE-sampled DDR data to the output flip-flop 360 based on commands from the selector 380, as discussed further below. The output flip-flop 360 samples (captures) the output of the multiplexer 260 on the falling edges of the clean clock signal to produce clean DDR data that is aligned with the clean clock signal. Thus, the synchronization circuit 330 retimes the DDR data from the data clock domain to the clean clock domain. As discussed above, the clean clock signal may be used for the DDR clock output to the DDR SDRAM, in which case, the synchronization circuit 330 synchronizes the DDR data with the DDR clock output.

As discussed above, the clean clock signal from the cleanup PLL 225 and the data clock signal may have the same frequency, but not necessarily the same phase. The phase detector 370 receives the clean clock signal and the data clock signal, and determines the phase difference (offset) between the two clock signals. The granularity of the phase detection may be a quarter of a clock cycle (period) or finer granularity. The selector 380 commands the multiplexer 360 to select the RE-sampled DDR data from the RE flip-flop 340 or the FE-sampled DDR data from the FE flip-flop 350 based on the phase detection from the phase detector 370, as discussed further below.

In one embodiment, the selector 380 determines whether a falling edge (sampling edge) of the data clock signal is closer to a rising edge or a falling edge of the clean clock signal based on the phase detection from the phase detection 370. If the falling edge (sampling edge) of the data clock signal is closer to the rising edge of the clean clock signal, then the selector 380 commands the multiplexer 360 to select the FE-sampled DDR data from the FE flip-flop 350. If the falling edge (sampling edge) of the data clock signal is closer to the falling edge of the clean clock signal, then the selector 380 commands the multiplexer 360 to select the RE-sampled DDR data from the RE flip-flop 340. Thus, the selector 380 selects the output of the flip-flop 340 and 350 that samples the DDR data on an edge of the clean clock signal that is farther away from the falling edge (sampling edge) of the data clock signal. This is because the DDR data from the first-stage flip-flop 335 changes on the falling edges (sampling edges) of the data clock signal. As a result, the DDR data from the first-stage flip-flop 335 is more likely to be stable (and therefore less likely to cause a metastable state) when sampled on an edge of the clean clock signal that is farther away from the falling edge (sampling edge) of the data clock signal.

In one embodiment, the granularity of the phase detector 370 is a quarter of a clock cycle (period). In this regard, FIG. 4 shows an example of a clean clock signal 410, in which each cycle of the clean clock signal 410 is divided into four quadrants (labeled one to four). In this embodiment, the phase detector 370 may output a value indicating in which of the four quadrants of the clean clock signal 410 a falling edge (sampling edge) of the data clock signal lies. If the phase detector 370 indicates that the falling edge of the data clock signal lies in quadrant one or quadrant four, then the falling edge of the data clock signal may be considered to be closer to a rising edge of the clean clock signal 410 than a falling edge of the clean clock signal 410. In this case, the selector 380 may command the multiplexer 360 to select the FE-sampled DDR data from the FE flip-flop 350. If the phase detector 370 indicates that the falling edge of the data clock signal lies in quadrant two or quadrant three, then the falling edge of the data clock signal may be considered to be closer to a falling edge of the clean clock signal 410 than a rising edge of the clean clock signal 410. In this case, the selector 380 may command the multiplexer 360 to select the RE-sampled DDR data from the RE flip-flop 340.

Figure 5:
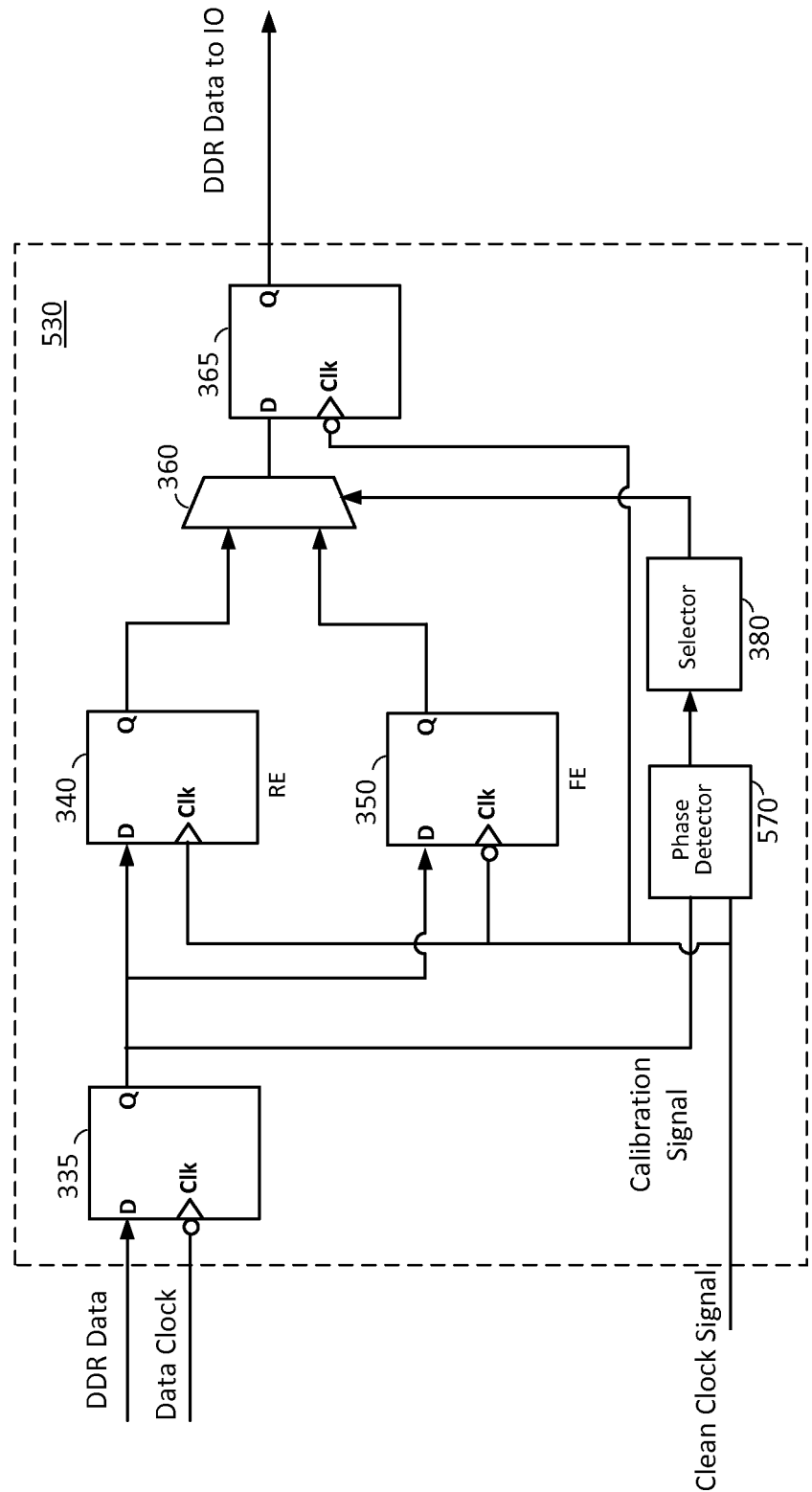
FIG. 5 shows a synchronization circuit according to another embodiment of the present disclosure.

FIG. 5 shows a synchronization circuit 530 according to another embodiment, in which the phase detector 570 performs phase detection using a calibration signal from the memory controller 115. The memory controller 115 may periodically output a calibration signal to the synchronization circuit 530. For example, the memory controller 115 may output a calibration signal once every M number of cycles of the data clock signal. Each calibration signal may comprise a pulse signal or other type of signal. The memory controller 115 may periodically output a calibration signal on a data line used to transport DDR data from the memory controller 115 to the synchronization circuit 530, in which DDR data and the calibration signal are sent at different times on the data line.

When a calibration signal is output from the memory controller 115, the first-stage flip-flop 335 captures the calibration signal on a falling edge (sampling edge) of the data clock signal. As a result, the rising edge of the captured calibration signal is approximately aligned with the falling edge (sampling edge) of the data clock signal. The phase detector 570 receives the captured calibration signal from the first-stage flip-flop 335 and determines the phase difference (offset) between the rising edge of the captured calibration signal and a rising edge of the clean clock signal. Since the rising edge of the captured calibration signal is approximately aligned with the falling edge (sampling edge) of the data clock signal, the phase difference is approximately equal to the phase difference between the falling edge (sampling edge) of the data clock signal and the rising edge of the clean clock signal.

The phase detector 570 outputs the determined phase difference to the selector 380, which commands the multiplexer 360 to select the RE-sampled DDR data from the RE flip-flop 340 or the FE-sampled DDR data from the FE flip-flop 350 based on the phase difference. For example, if the phase detector 570 has a granularity of a quarter of a clock cycle, then the selector 380 may command the multiplexer 360 to select the RE-sampled DDR data from the RE flip-flop 340 when the phase detector 570 indicates that the rising edge of the captured calibration signal lies in quadrant two or three. The selector 380 may command the multiplexer 360 to select the FE-sampled DDR data from the FR flip-flop 350 when the phase detector 570 indicates that the rising edge of the captured calibration signal lies in quadrant one or four.

In one embodiment, the selector 380 commands the multiplexer 360 to select the RE flip-flop 340 or the FE flip-flop 350 based on the phase detection using the most recently received calibration signal. Thus, the selection is only updated when a calibration signal is received from the memory controller 115 and remains constant between calibration signals. As a result, the frequency of phase detections (and hence selector updates) can be controlled by controlling the frequency of calibration signals. The frequency of the calibration signals can be controlled and fine-tuned based on characterization of jitter in the SoC 110.

Figure 6:
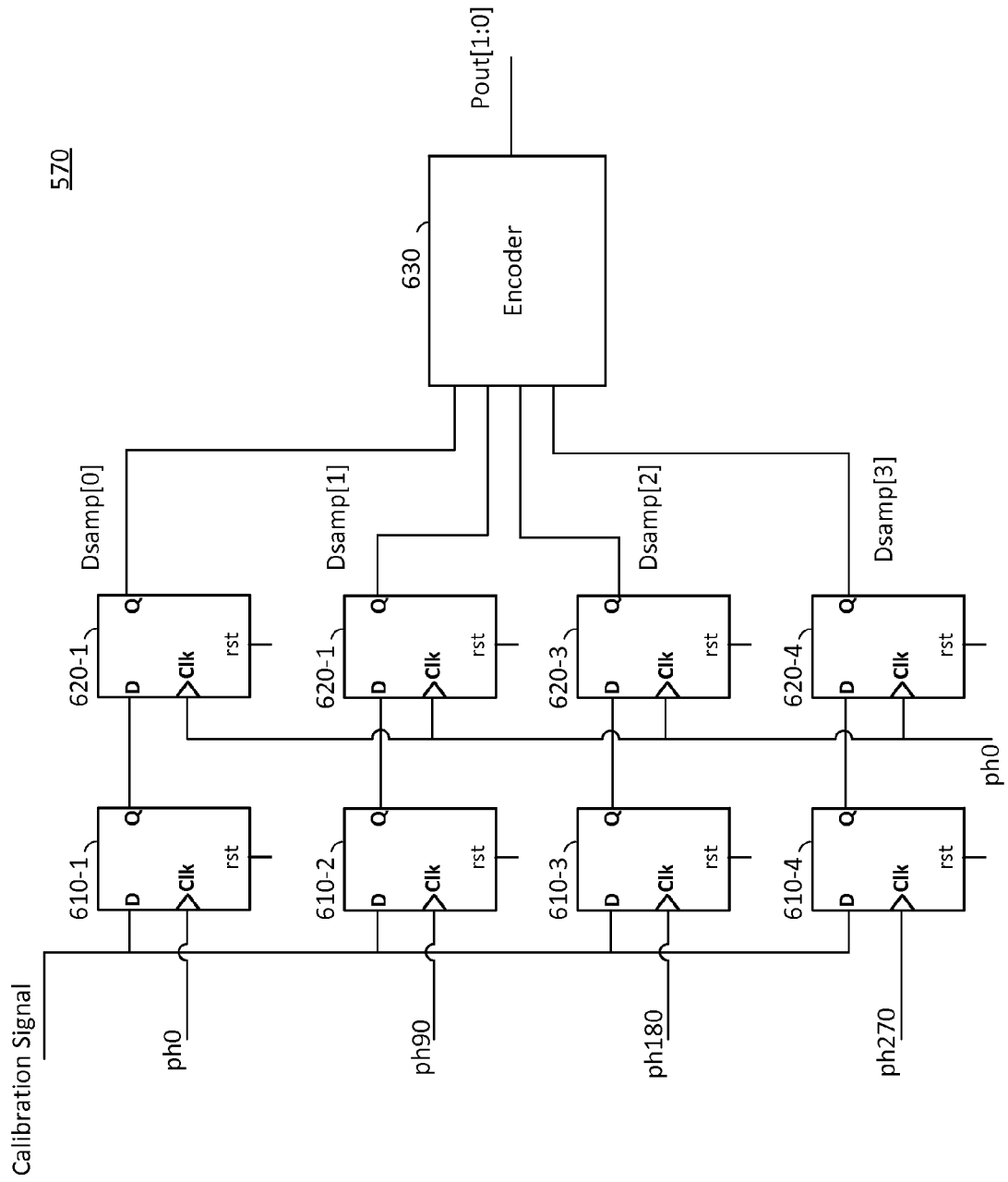
FIG. 6 shows a phase detector according to an embodiment of the present disclosure.

FIG. 6 shows an exemplary implementation of the phase detector 570 according to an aspect of the present disclosure. In this embodiment, the phase detector 570 has a granularity of a quarter of a clock cycle. The phase detector 570 comprises a first input flip-flip 610-1, a second input flip-flop 610-2, a third input flip-flop 610-3, a fourth input flip-flop 610-2, a first output flip-flop 620-1, a second output flip-flop 620-2, a third output flip-flop 620-3, a fourth output flip-flop 610-4, and an encoder 630.

Each of the first, second, third and fourth input flip-flops 610-1 to 610-4 receives a calibration signal from the output of the first-stage flip-flop 335 at its data input D. The first input flip-flop 610-1 receives the clean clock signal at its clock input Clk, the second input flip-flop 610-2 receives the clean clock signal shifted by 90 degrees at its clock input Clk, the third input flip-flop 610-3 the clean clock signal shifted by 180 degrees at its clock input Clk, and the fourth input flip-flop 610-4 receives the clean clock signal shifted by 270 degrees at its clock input Clk.

The first input flip-flop 610 samples the calibration signal on a rising edge of the clean clock signal, the second input flip-flop 610-2 samples the calibration signal on a rising edge of the clean clock signal shifted by 90 degrees, the third input flip-flop 610-3 samples the calibration signal on a rising edge of the clean clock signal shifted by 180 degrees, and the fourth input flip-flop 610-4 samples the calibration signal on a rising edge of the clean clock signal shifted by 270 degrees. Thus, the first, second, third and fourth input flip-flops 610-1 to 610-4 sample the calibration signal at four different sample points spaced 90 degrees apart from one another.

Each of the output flip-flops 620-1 to 620-4 is coupled to the output of a respective one of the input flip-flops 610-1 to 610-4. For instance, the first output flip-flop 620-1 is coupled to the output of the first input flip-flop 610-1, the second output flip-flop 620-2 is coupled to the output of the second input flip-flop 610-2, and so forth. Each of the output flip-flops 620-1 to 620-4 samples (captures) the output value of the respective input flip-flop 610-1 to 610-4 on a rising edge of the clean clock signal and outputs the sampled output value to the encoder 630. Thus, the encoder 630 receives four values (denoted Dsamp[0] to Dsamp [3] in FIG. 6), where each value corresponds to the calibration signal sampled at a different one of the four sample points.

The encoder 630 then determines in which quadrant the rising edge of the calibration signal lies based on the four values from the output flip-flops 620-1 to 620-4, and outputs a phase-detection signal indicating the determined quadrant to the selector 380. The phase-detection signal may be a two-bit signal (denoted Pout[1:0] in FIG. 6) identifying the quadrant in which the rising edge of the calibration signal lies.

Figure 7:
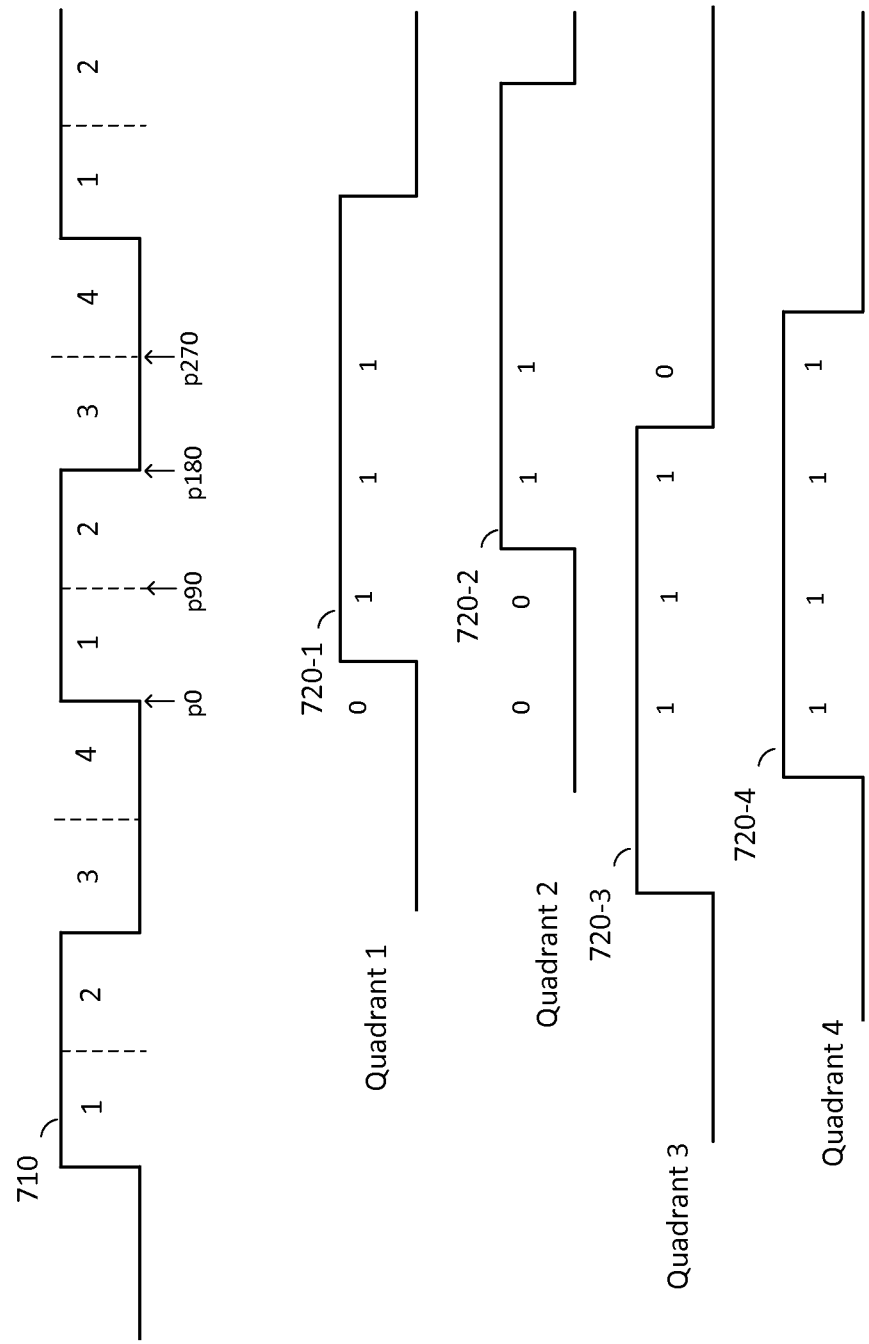
FIG. 7 shows an example of four calibration signals aligned in different quadrants of a clean clock signal according to an embodiment of the present disclosure.

Operation of the phase detector 570 will now be described according to one embodiment with reference to FIG. 7. FIG. 7 shows an example of the clean clock signal 710, in which each clock cycle is divided into four quadrants. FIG. 7 also shows four sample points ph0, ph90, ph180 and ph270 corresponding to the first, second, third and fourth input flip-flops 610-1, 610-2, 610-3 and 610-4, respectively. FIG. 7 further shows four exemplary calibration signals 720-1 to 720-4, in which each calibration signal has a rising edge lying in a different quadrant of the clean clock signal 710, and each calibration signal has a pulse width equal to approximately one clock cycle.

For each of the calibration signals 710-1 to 710-4, FIG. 7 shows the four output values from the first, second, third and fourth input flip-flops 610-1 to 610-4 for that calibration signal. For example, for the calibration signal 710-1 having a rising edge lying in quadrant one, the first input flip-flop 610-1 outputs a logic zero, and each of the second, third and fourth input flip-flops 610-2, 610-3 and 610-4 outputs a logic one (represented by "0111" on the waveform of the calibration signal 720-1). For the calibration signal 710-2 having a rising edge lying in quadrant two, each of the first and second input flip-flops 610-1 and 610-2 outputs a logic zero, and each of the third and fourth input flip-flops 610-3 and 610-4 outputs a logic one (represented by "0011" on the waveform of the calibration signal 720-2). For the calibration signal 710-3 having a rising edge lying in quadrant three, each of the first, second and third input flip-flops 610-1, 610-2 and 610-3 outputs a logic one, and the fourth input flip-flop 610-4 outputs a logic zero (represented by "1110" on the waveform of the calibration signal 720-3). Finally, for the calibration signal 710-4 having a rising edge lying in quadrant four, each of the first, second, third and fourth input flip-flops 610-1 to 610-4 outputs a logic one (represented by "1111" on the waveform of the calibration signal 720-4). The encoder 630 may be programmed to determine in which quadrant the rising edge of a calibration signal lies according to the output values given above for each quadrant.

Figure 8:
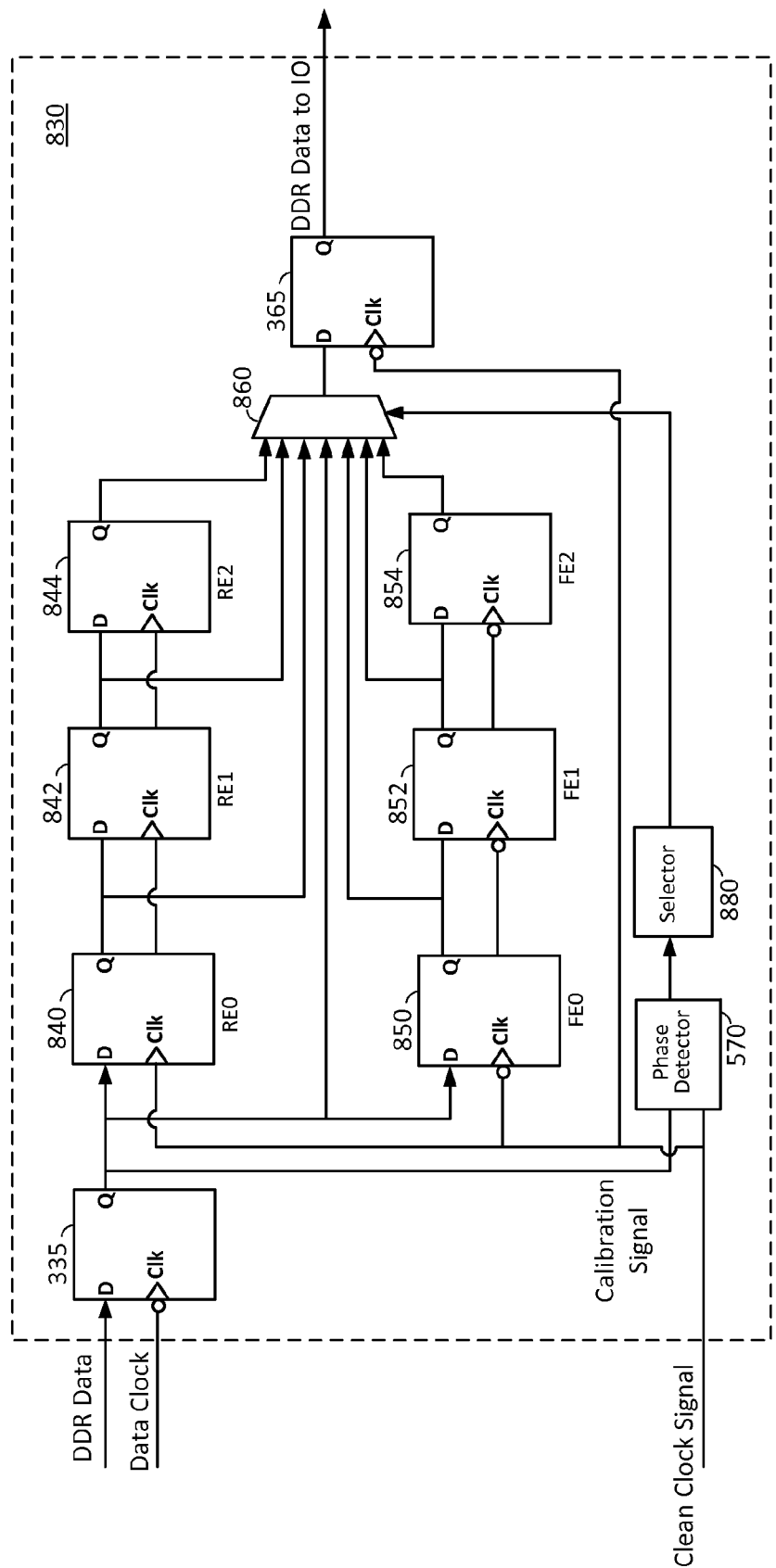
FIG. 8 shows a synchronization circuit capable of preventing cycle slips according to an embodiment of the present disclosure.

FIG. 8 shows a synchronization circuit 830 according to another embodiment of the present disclosure. The synchronization circuit 830 is similar to the one shown in FIG. 5, except the synchronization circuit 830 comprises first, second and third RE flip-flops 840, 842 and 844, and first, second and third FE flip-flops 850, 852 and 854.

The first, second and third RE flip-flops 844, 842 and 842 are coupled in series. The first RE flip-flop 840 samples the output of the first-stage flip-flop 335 on the rising edges of the clean clock signal, the second RE flip-flop 842 samples the output of the first RE flip-flop 840 on the rising edges of the clean clock signal, and the third RE flip-flop 844 samples the output of the second RE flip-flop 842 on the rising edges of the clean clock signal.

The first, second and third FE flip-flops 854, 852 and 854 are coupled in series. The first FE flip-flop 850 samples the output of the first-stage flip-flop 335 on the falling edges of the clean clock signal, the second FE flip-flop 852 samples the output of the first FE flip-flop 850 on the falling edges of the clean clock signal, and the third FE flip-flop 854 samples the output of the second FE flip-flop 852 on the falling edges of the clean clock signal.

The input of the multiplexer 860 is coupled to the outputs of the RE flip-flops 840, 842 and 844, the outputs of the FE flip-flops 850, 852 and 854, and the output of the first-stage flip-flop 335. The selector 880 commands the multiplexer 360 to select the output of one of the flip-flops based on phase-detection signals from the phase detector 570. The multiplexer 360 couples the selected output to the output flip-flop 365, which samples (captures) the selected output on the falling edges of the clean clock signal to produce DDR data that is synchronized with the clean clock signal (which may be used for the DDR clock output).

Thus, the flip-flops 335, 840, 842, 844, 850, 852 and 854 provide sampled data corresponding to seven different sample points. The sample points of the first, second and third RE flip-flops 840, 842 and 844 are offset by one clock cycle from one another. The sample points of first, second and third FE flip-flops 850, 852 and 854 are offset by one clock cycle from one another, and offset by half a clock cycle from the sample points of the first, second and third RE flip-flops 840, 842 and 844. Thus, by selecting the output of one of the flip-flops, the selector 880 selects the sample point corresponding to the selected flip-flop.

The synchronization circuit 830 according to this embodiment is able to prevent cycle slips between different PHY blocks. A cycle slip may occur when two data bytes corresponding to the same clock cycle at the memory controller 115 are sampled (captured) at different clock cycles at the respective PHY blocks. As a result, two data bytes that are aligned at the memory controller 115 are no longer aligned at the PHY blocks. The synchronization circuit 830 is able to prevent a cycle slip by pulling in or pushing out the output of the synchronization circuit 830, as discussed further below.

A cycle slip may be caused when the phase difference between the data clock signal and the clean clock signal drifts over time at one PHY block, but not at another PHY block or drifts by a different amount at another PHY block. The phase drift may be caused by temperature changes in the SoC and/or another cause. A static cycle slip may be caused by static delay mismatches between the memory controller 115 and different PHY blocks. The synchronization circuit 830 is able to prevent both types of cycle slips.

To prevent a cycle slip due to phase drift, the selector 880 may be configured to detect the phase drift between calibration signals from the memory controller 115 and the clean clock signal, and adjust the selection of the multiplexer 360 accordingly to compensate for the detected drift. If the phase drift is gradual, then the selector 880 may detect the drift by tracking changes in the phase-detection signals from the phase detector 570 over time.

For the embodiment in which the phase detector 570 outputs a phase-detection signal indicating in which quadrant the rising edge of a calibration signal lies, the selector 880 may detect the phase drift by tracking changes in the quadrant indicated by the phase-detection signals. Assuming the phase drift is less than 90 degrees between phase-detection signals, the selector 880 can determine the direction of the phase drift based on changes in the quadrant indicated by the phase-detection signals. The selector 880 may then adjust the flip-flop selection by the multiplexer 360 to compensate for the detected phase drift, thereby preventing a cycle slip.

In one embodiment, the selector 880 may be implemented using a truth table 905, an example of which is shown in FIG. 9. In the truth table 905, each row corresponds to a quadrant and each column corresponds to a different one of the flip-flops from which the multiplexer 860 can choose. The first, second and third RE flip-flops 840, 842 and 844 are represented by RE0, RE1 and RE2, respectively, in the truth table 905. The first, second and third FE flip-flops 850, 852 and 854 are represented by FE0, FE1 and FE2, respectively, in the truth table 905. The first-stage flip-flop 335 is represented by "Launch" in the truth table 905 since the output of the first-stage flip-flop 335 is a data launch point in the synchronization circuit 830.

In the truth table 905, each quadrant is annotated with a (n), (n+1) or (n−1). This is used to distinguish quadrants corresponding to different amounts of phase drift. For example, in the truth table 905, quadrant 4(n+1) may correspond to a phase drift of one clock cycle from quadrant 4(n) in one direction, and quadrant 4(n−1) may correspond to a phase drift of one clock cycle from quadrant 4(n) in the opposite direction.

In one embodiment, the selector 880 may start at a certain entry in the truth table 905, and select one of the flip-flops based on the starting entry. For example, the phase detector 570 may initially output a phase-detection signal indicating quadrant one. In this example, the selector 800 may start at the entry corresponding to quadrant 1(n) in the truth table 905 and select the output of the first FE flip-flop 850. After the starting condition is established, the selector 880 can update the flip-flop selection using the truth table 905 to compensate for phase drift, as discussed further below.

For example, when the quadrant indicated by the phase-detection signals changes from quadrant one to quadrant two after initialization, the selector 880 moves to the entry corresponding quadrant 2(n) in the truth table 905 and selects the output of the first RE flip-flop 840. When the quadrant indicated by the phase-detection signals subsequently changes from quadrant two to quadrant three, the selector 880 moves to the entry corresponding to quadrant 3(n+1) in the truth table 905. In this case, the flip-flop selection does not change. When the quadrant indicated by the phase-detection signals subsequently changes from quadrant three to quadrant four, the selector 880 moves to the entry corresponding to quadrant 4(n+1) and selects the output of the first-stage flip-flop 335. In this example, the quadrant changes due to phase drift causes the selector 380 to move to the right of the truth table 905, and therefore pull in the output of the selector 380 to compensate for the phase drift.

In another example, when the quadrant indicated by the phase-detection signals changes from quadrant one to quadrant four after initialization, the selector 880 moves to the entry corresponding quadrant 4(n) in the truth table 905. In this case, the flip-flop selection does not change. When the quadrant indicated by the phase-detection signals subsequently changes from quadrant four to quadrant three, the selector 880 moves to the entry corresponding to quadrant 3(n) in the truth table 905 and selects the output of the second RE flip-flop 852. When the quadrant indicated by the phase-detection signals subsequently changes from quadrant three to quadrant two, the selector 880 moves to the entry corresponding to quadrant 2(n−1). In this case the flip-flop selection is not changed. When the quadrant indicated by the phase-detection signals subsequently changes from quadrant two to quadrant one, the selector 880 moves to the entry corresponding to quadrant 1(n−1) in the truth table 905 and selects the output of the second FE flip-flop 852. In this example, the quadrant changes due to phase drift causes the selector 380 to move to the left of the truth table 905, and therefore push out the output of the selector 380 to compensate for the phase drift.

Thus, the truth table 905 can be used to adjust the flip-flop selection by the multiplexer 860 to compensate for phase drift in either direction. Although, the starting entry corresponds to quadrant 1(n) in the truth table 905 in the example discussed above, it is to be appreciated that embodiments of the present disclosure are not limited to this example. For example, the phase detector 570 may initially output a phase-detection signal indicating quadrant four. In this example, the selector 880 may use the entry corresponding to quadrant 4(n) in the truth table 905 as the starting point. Thus, the starting entry may depend on the initial quadrant indicated by the phase detector 570. Further, it is to be appreciated that embodiments of the present disclosure are not limited to the particular truth-table entries shown in the FIG. 9.

As discussed a static cycle slip may be caused by static delay mismatches between the memory controller 115 and different PHY blocks (e.g., mismatches in the lengths of the signal paths from the memory controller 115 to the different PHY blocks). As a result of static cycle slip, two data bytes that are in the same cycle at the memory controller 115 may end up in different cycles at the PHY blocks.

To address static cycle slip, the present disclosure provides a methodology for determining static cycle slip between a plurality of PHY blocks on a SoC and calibrating out the static cycle slip. In one embodiment, each of the PHY blocks may include the synchronization circuit 830 shown in FIG. 8.

During boot time of the SoC or shortly thereafter, the memory controller 115 sends a calibration signal to each of the PHY blocks. The phase detector 570 at each of the PHY blocks determines in which quadrant of the DDR clock signal the respective calibration signal is aligned. Each PHY block may then report the determined quadrant to the memory controller 115 or another controller. If each of the PHY blocks reports the same quadrant, then the memory controller 115 may do nothing. However, if the PHY blocks report different quadrants, then static delay mismatch is evident. In this case, the memory controller 115 may analyze the different quadrants reported by the PHY blocks to determine whether the static mismatch results in is a static cycle slip, and if so determine how to calibrate out the static cycle slip.

In this regard, FIG. 10 shows an example of the quadrants reported by three PHY blocks. A first one of the PHY blocks is used for the CA signal, a second one of the PHY blocks is used for data byte DQ0, and a third one of the PHY blocks is used for data byte DQ1. In this example, the first PHY block is aligned in quadrant one, the second PHY block is aligned in quadrant two, and the third PHY block is aligned quadrant three. The up arrow on the DDR clock signal indicates the alignment of the outputs of the PHY blocks. In this example, the outputs of the PHY blocks are aligned and a static cycle slip correction is not needed.

FIG. 11 shows an example in which the first PHY block is aligned in quadrant two, the second PHY block is aligned in quadrant three, and the third PHY block is aligned quadrant four. In this example, the outputs of the PHY blocks are also aligned.

Figures 12, 13:
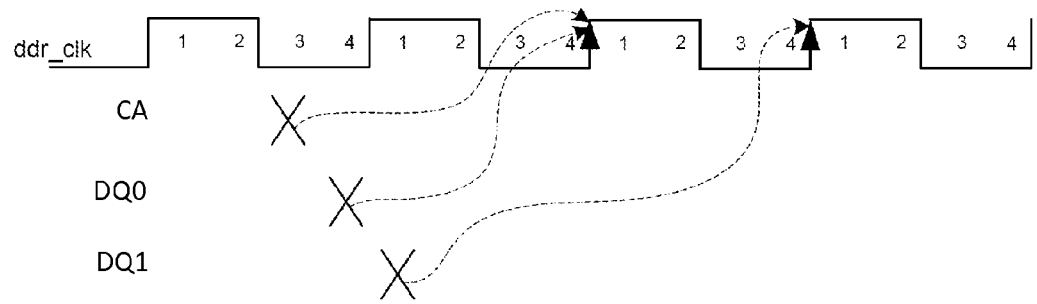
FIG. 12 shows an example of a delay mismatch between PHY blocks resulting in a static cycle slip.
FIG. 13 shows a truth table comprising default entries and push-out entries according to an embodiment of the present disclosure.

FIG. 12 shows an example in which the first PHY block is aligned in quadrant three, the second PHY block is aligned in quadrant four, and the third PHY block is aligned quadrant one. In this example, the outputs of the first and second PHY blocks are aligned. However, the output of third PHY block is offset from the outputs of the first and second PHY blocks by one clock cycle, resulting in a static cycle slip. The static cycle slip can be corrected by pulling in the output of the third PHY blocks by one clock cycle to align with the outputs of the first and second PHY blocks.

Alternatively, the static cycle slip may be corrected by pushing out the outputs of the first and second PHY blocks by one clock cycle to align with the output of the third PHY block. In this case, the memory controller 115 may send instructions to the first and second PHY blocks to push out by one clock cycle to correct the static cycle slip. The synchronization circuit 830 in each of the first and second PHY blocks may then push out the respective output by one clock cycle by changing the flip-flop selection by the respective multiplexer 860. For example, if the first FE flip-flop 850 is initially selected, then the synchronization circuit 830 may push out by one clock cycle by shifting to the second FE flip-flop 852, which is delayed by one clock cycle from the first FE flip-flop 850.

FIG. 13 shows a truth table 1305 according to one embodiment. The truth table 1305 includes a set of default entries (labeled "DEF") and a set of push-out entries (labeled "PUSH"). The DEF entries correspond to a default condition and the PUSH entries correspond to a push out of one clock cycle from the default condition. In this embodiment, PHY blocks that are not pushed out perform flip-flop selection using the DEF entries in the truth table, and PHY blocks that are pushed out to correct a static cycle slip perform flip-flop selection using the PUSH entries in the truth table 1305. For the example shown in FIG. 12, the synchronization circuits 830 in the first and second PHY blocks may use the PUSH entries to perform flip-flop selection since they are instructed to push out. The synchronization circuit 830 in the third PHY block may use the DEF entries to perform flip-flop selection.

Figures 14, 15:
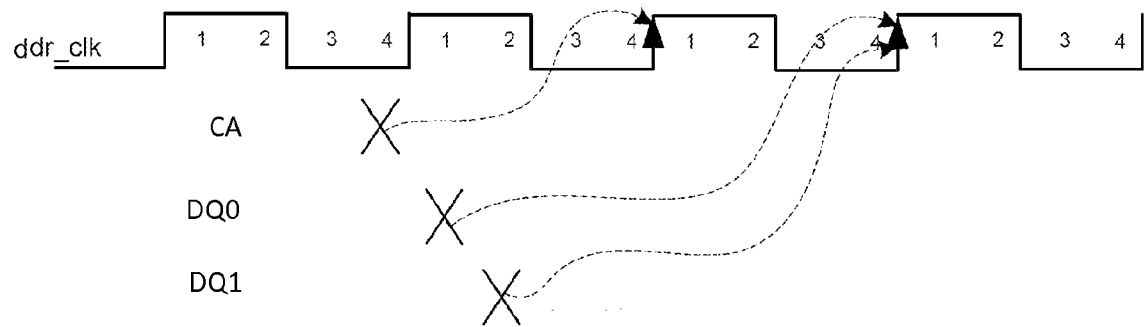
FIG. 14 shows another example of a delay mismatch between PHY blocks resulting in a static cycle slip.
FIG. 15 shows a truth table comprising default entries and push-out entries according to another embodiment of the present disclosure.

FIG. 14 shows an example in which the first PHY block is aligned in quadrant four, the second PHY block is aligned in quadrant one, and the third PHY block is aligned in quadrant two. In this example, the outputs of the second and third PHY blocks are aligned. However, the output of the first PHY block is offset from the outputs of the second and third PHY blocks by one clock cycle, resulting in a static cycle slip. The static cycle slip can be corrected by pulling in the outputs of the second and third PHY blocks by one clock cycle to align with the output of the first block PHY block.

Alternatively, the static cycle slip may be corrected by pushing out the output of the first PHY block by one clock cycle to align with the outputs of the second and third PHY blocks. In this case, the memory controller 115 may send instructions to the first PHY block to push out by one clock cycle to correct the static cycle slip.

FIG. 15 shows a truth table 1505 according to one embodiment. The truth table 1505 includes a set of default entries (labeled "DEF") and a set of push-out entries (labeled "PUSH"). In this embodiment, PHY blocks that are not pushed out perform flip-flop selection using the DEF entries in the truth table 1505, and PHY blocks that are pushed out to correct a static cycle slip perform flip-flop selection using the PUSH entries in the truth table 1505. For the example shown in FIG. 14, the synchronization circuit 830 in the first PHY block may use the PUSH entries to perform flip-flop selection, and the synchronization circuits 830 in the second and third PHY blocks may use the DEF entries to perform flip-flop selection.

It is to be appreciated that the methodology for correcting static cycle drift is not limited to the particular examples given above. For example, instead of sending one calibration signal to each PHY block, the memory controller 115 may output a plurality of calibration signals to each PHY block. In this example, each PHY block may determine a quadrant for each of the calibration signals, and report the quadrant that is determined the most for the calibration signals to the memory controller 115.

In another example, the memory controller 115 may instruct one or more PHY blocks to pull in by one clock cycle to correct a detected static cycle slip. In this example, the truth table may include pull-in (PULL) entries located to the right of the DEF entries in the truth table, and a PHY block that is instructed to pull in may use the PULL entries for performing flip-flop selection. For instance, the static cycle slip shown in the example in FIG. 12 may be corrected by pulling in the third PHY block by one clock cycle so that the output of the third PHY block aligns with the outputs of the first and second PHY blocks. In this case, the third PHY block may use the PULL entries and the first and second PHY blocks may use the DEF entries.

Figure 16:
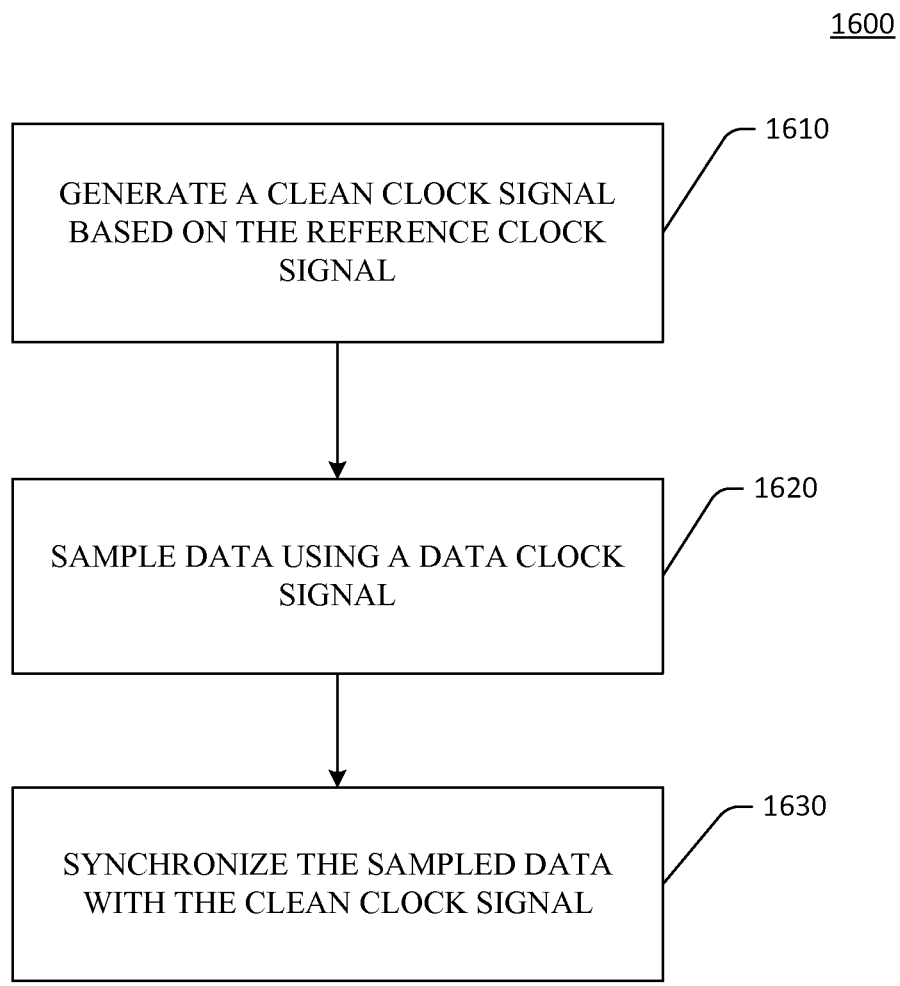
FIG. 16 is a flowchart for a method of synchronizing data according to embodiment of the present disclosure.

FIG. 16 is a flow diagram of a method 1600 for synchronizing data according to an embodiment of the present disclosure. The method 1600 may be performed at a PHY block located near a periphery of the SoC to retime data from the memory controller 115 with a clean clock signal, which may be used as a clock output (e.g., DDR clock output) to an external memory (e.g., DDR SDRAM).

In step 1610, a clean clock signal is generated based on a reference clock signal. For example, the clean clock signal may be generated by a phase-locked loop (PLL) (e.g., cleanup PLL 225) that attenuates jitter in the reference clock signal.

In step 1620, data is sampled using a data clock signal. For example, the data and the data clock signal may be sent from a memory controller (e.g., memory controller 115), and may travel a relative long distance across the SoC from the memory controller (which may be centrally-located on the SoC) to the periphery of the SoC. The data may be sampled using a flip-flop (e.g., the input flip-flop) that samples (captures) the data on the rising edges or falling edges of the data clock signal.

In step 1630, the sampled data is synchronized with the clean clock signal. For example, the sampled data may be sampled by one or more flip-flops that are clocked using the clean clock signal (e.g., or more of flip-flops 840, 842, 844, 850, 852, 854 and 365).

Those skilled in the art will appreciate that embodiments of the present disclosure are not limited to the examples described herein. For example, the first-stage flip-flop may sample the DDR data on the rising edges of the data clock signal. In this case, the sampling edges of the first-stage flip-flop would correspond to the rising edges of the data clock signal. Further, the synchronization circuit 830 may comprise any number of RE flip-flops and any number of FE flip-flops. For example, the number of RE flip-flops and FE flip-flops may be increased to allow the synchronization circuit to correct for phased drifts over a wider range, if needed. In this case, the truth table may be expanded to include entries for the additional RE flip-flops and FE flip-flops.

Those skilled in the art will further appreciate that the various illustrative blocks, circuits, and steps described in connection with the disclosure herein may be implemented as electronic hardware, computer software, or combinations of both. To clearly illustrate this interchangeability of hardware and software, various illustrative components, blocks, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative blocks and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A memory interface, comprising:
a clock phase-locked loop (PLL) configured to receive an input clock signal, and to output an output clock signal based on the input clock signal;
a memory controller configured to output a data clock signal based on the output clock signal, and to output data synchronized with the data clock signal;
a cleanup PLL configured to receive a reference clock signal derived from the output clock signal, and to generate a clean clock signal based on the reference clock signal; and
a synchronization circuit configured to receive the data, the data clock signal, and the clean clock signal, wherein the synchronization circuit is further configured to sample the data using the data clock signal, and to synchronize the sampled data with the clean clock signal.

2. The memory interface of claim 1, wherein the synchronization circuit and the cleanup PLL are located near a periphery of a chip, and the the memory controller is located approximately at a center of the chip.

3. The memory interface of claim 1, wherein the clean clock signal and the data clock signal have approximately the same frequency.

4. The memory interface of claim 1, further comprising a frequency divider configured to divide the frequency of the output clock signal to generate the reference clock signal.

5. The memory interface of claim 4, wherein the frequency divider is configured to divide the frequency of the output clock signal by approximately N and the cleanup PLL is configured to multiply the frequency of the reference clock signal by approximately N.

6. The memory interface of claim 1, further comprises a clock path and a data path between the memory controller and the synchronization circuit, wherein the clock path is configured to transport the data clock signal from the memory controller to the synchronization circuit, the data path is configured to transport the data from the memory controller to the synchronization circuit, and each of the clock path and the data path has a length of between 10 mm and 20 mm.

7. A memory interface, comprising:
a cleanup phase-locked loop (PLL) configured to receive a reference clock signal, and to generate a clean clock signal based on the reference clock signal; and
a synchronization circuit configured to receive data, a data clock signal, and the clean clock signal, wherein the synchronization circuit is further configured to sample the data using the data clock signal, and to synchronize the sampled data with the clean clock signal;
wherein the synchronization circuit comprises:
an input flip-flop configured to sample the data on sampling edges of the data clock signal;
a rising-edge (RE) flip-flop configured to sample an output of the input flip-flop on rising edges of the clean clock signal;
a falling-edge (FE) flip-flop configured to sample the output of the input flip-flop on falling edges of the clean clock signal;
a phase detector configured to determine a phase difference between the data clock signal and the clean clock signal; and
a selector configured to select an output of the RE flip-flop or an output of the FE flip-flop based on the determined phase difference.

8. The memory interface of claim 7, wherein the selector is configured to determine whether a sampling edge of the data clock signal is closer to a rising edge of the clean clock signal or a falling edge of the clean clock signal based on the determined phase difference, to select the output of the RE flip-flop if the sampling edge of the data clock is closer to the falling edge of the clean clock signal, and to select the output of the FE flip-flop if the sampling edge of the data clock signal is closer to the rising edge of the clean clock signal.

9. The memory interface of claim 7, wherein the input flip-flop is configured to sample a calibration signal on a sampling edge of the data clock signal, and the phase detector is configured to determine the phase difference between the data clock signal and the clean clock signal by determining a phase difference between the sampled calibration signal and the clean clock signal.

10. A memory interface, comprising:
a cleanup phase-locked loop (PLL) configured to receive a reference clock signal, and to generate a clean clock signal based on the reference clock signal; and
a synchronization circuit configured to receive data, a data clock signal, and the clean clock signal, wherein the synchronization circuit is further configured to sample the data using the data clock signal, and to synchronize the sampled data with the clean clock signal;
wherein the synchronization circuit comprises:
an input flip-flop configured to sample the data on sampling edges of the data clock signal;
a first rising-edge (RE) flip-flop configured to sample an output of the input flip-flop on rising edges of the clean clock signal;
a second RE flip-flop configured to sample an output of the first RE flip-flop on the rising edges of the clean clock signal;
a first falling-edge (FE) flip-flop configured to sample the output of the input flip-flop on falling edges of the clean clock signal;
a second FE flip-flop configured to sample an output of the first FE flip-flop on falling edges of the clean clock;
a phase detector configured to determine a phase difference between the data clock signal and the clean clock signal; and
a selector configured to select, based on the determined phase difference, the output of the first RE flip-flop, an output of the second RE flip-flop, the output of the first FE flip-flop, or an output of the second FE flip-flop.

11. The memory interface of claim 10, wherein the selector is configured to perform the selection using a truth table.

12. The memory interface of claim 11, wherein the truth table comprises a first set of entries and a second set of entries, and the selector is configured to perform the selection using the first set of entries in a default condition and to perform the selection using the second set of entries if the selector receives an instruction to push out or pull in an output of the synchronization circuit.

13. A method for data synchronization, comprising:
generating an output clock signal based on an input clock signal using a clock phase-locked loop (PLL);
outputting, from a memory controller, a data clock signal based on the output clock signal;
outputting, from the memory controller, data synchronized with the data clock signal;

generating a clean clock signal based on a reference clock signal derived from the output clock signal using a cleanup PLL;
sampling the data using the data clock signal; and
synchronizing the sampled data with the clean clock signal.

14. The method of claim 13, wherein the memory controller is located approximately at a center of a chip, and the sampling and the synchronizing are performed near a periphery of the chip.

15. The method of claim 13, wherein generating the clean clock signal comprises attenuating jitter in the reference clock signal using the cleanup PLL.

16. A method for data synchronization, comprising:
generating a clean clock signal based on a reference clock signal;
sampling data using a data clock signal;
sampling the sampled data on rising edges of the clean clock signal to produce rising-edge (RE) sampled data;
sampling the sampled data on falling edges of the clean clock signal to produce falling-edge (FE) sampled data;
determining a phase difference between the data clock signal and the clean clock signal; and
selecting the RE sampled data or the FE sampled data based on the determined phase difference.

17. The method of claim 16, wherein selecting the RE sampled data or the FE sampled data comprises:
determining whether a sampling edge of the data clock signal is closer to a rising edge of the clean clock signal or a falling edge of the clean clock signal based on the determined phase difference;
selecting the RE sampled data if the sampling edge of the data clock is closer to the falling edge of the clean clock signal; and
selecting the FE sampled data if the sampling edge of the data clock signal is closer to the rising edge of the clean clock signal.

18. The method of claim 16, wherein determining the phase difference between the data clock signal and the clean clock signal comprises:
sampling a calibration signal using the data clock signal; and
determining a phase difference between the sampled calibration signal and the clean clock signal.

19. A method for data synchronization, comprising:
generating a clean clock signal based on a reference clock signal;
sampling data using a data clock signal;
sampling the sampled data at a plurality of different sample points using the clean clock signal to produce clean-clock sampled data;
determining a phase difference between the data clock signal and the clean clock signal; and
selecting the clean-clock sampled data corresponding to one of the sample points based on the determined phase difference.

20. An apparatus for data synchronization, comprising:
means for generating an output clock signal based on an input clock signal;
means for outputting a data clock signal based on the output clock signal;
means for outputting data synchronized with the data clock signal;
means for generating a clean clock signal based on a reference clock signal derived from the output clock signal;
means for sampling the data using the data clock signal; and
means for synchronizing the sampled data with the clean clock signal.

21. The apparatus of claim 20, wherein the means for outputting the data clock signal and the means for outputting the data are located approximately at a center of a chip, and the means for sampling and the means for synchronizing are located near a periphery of the chip.

22. An apparatus for data synchronization, comprising:
means for generating a clean clock signal based on a reference clock signal;
means for sampling data using a data clock signal;
means for sampling the sampled data on rising edges of the clean clock signal to produce rising-edge (RE) sampled data;
means for sampling the sampled data on falling edges of the clean clock signal to produce falling-edge (FE) sampled data;
means for determining a phase difference between the data clock signal and the clean clock signal; and
means for selecting the RE sampled data or the FE sampled data based on the determined phase difference.

23. The apparatus of claim 22, wherein the means for selecting further comprises:
means for determining whether a sampling edge of the data clock signal is closer to a rising edge of the clean clock signal or a falling edge of the clean clock signal based on the determined phase difference;
means for selecting the RE sampled data if the sampling edge of the data clock is closer to the falling edge of the clean clock signal; and
means for selecting the FE sampled data if the sampling edge of the data clock signal is closer to the rising edge of the clean clock signal.

24. An apparatus for data synchronization, comprising:
means for generating a clean clock signal based on a reference clock signal;
means for sampling data using a data clock signal;
means for sampling the sampled data at a plurality of different sample points using the clean clock signal to produce a plurality of clean-clock sampled data;
means for determining a phase difference between the data clock signal and the clean clock signal; and
means for selecting the clean-clock sampled data corresponding to one of the sample points based on the determined phase difference.

25. A memory interface, comprising:
a cleanup phase-locked loop (PLL) configured to receive a reference clock signal, and to generate a clean clock signal based on the reference clock signal; and
a synchronization circuit configured to receive data, a data clock signal, and the clean clock signal, wherein the synchronization circuit is further configured to sample the data using the data clock signal, and to synchronize the sampled data with the clean clock signal;
wherein the synchronization circuit comprises:
an input flip-flop configured to sample the data on sampling edges of the data clock signal;
a first plurality of flip-flops coupled in series, wherein a first one of the first plurality of flip-flops is coupled to an output of the input flip-flop, and each of the first plurality of flip-flops is configured to sample data at a respective input on rising edges of the clean clock signal;
a second plurality of flip-flops coupled in series, wherein a first one of the second plurality of flip-flops is coupled to the output of the input flip-flop, and each of the second plurality of flip-flops is configured to sample data at a respective input on falling edges of the clean clock signal;

a phase detector configured to determine a phase difference between the data clock signal and the clean clock signal; and a selector configured to select an output of one of the first and second plurality of flip-flops based on the determined phase difference.

* * * * *